(12) United States Patent
Shih et al.

(10) Patent No.: US 8,022,503 B2
(45) Date of Patent: Sep. 20, 2011

(54) ANTI-FUSSE STRUCTURE AND METHOD OF FABRICATING THE SAME

(75) Inventors: Hung-Lin Shih, Hsinchu (TW);
Wen-Shiang Liao, Miaoli County (TW);
Tsan-Chi Chu, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 339 days.

(21) Appl. No.: 12/132,111

(22) Filed: Jun. 3, 2008

(65) Prior Publication Data
US 2009/0294903 A1    Dec. 3, 2009

(51) Int. Cl.
*H01L 23/525* (2006.01)
*H01L 21/02* (2006.01)

(52) U.S. Cl. ........ 257/530; 257/529; 257/E23.149; 257/E21.008; 438/396; 438/600

(58) Field of Classification Search .......... 257/529, 257/530, 532, 534, 665, E23.149, E23.147, 257/E21.008; 438/131, 132, 215, 281, 333, 438/467, 600, 601, 957
See application file for complete search history.

(56) References Cited

U.S. PATENT DOCUMENTS

| | | | |
|---|---|---|---|
| 6,124,194 A | 9/2000 | Shao et al. | |
| 6,549,447 B1 | 4/2003 | Fricke et al. | |
| 6,730,573 B1 | 5/2004 | Ng et al. | |
| 6,894,364 B2 * | 5/2005 | Hao et al. | 257/532 |
| 2007/0216029 A1 * | 9/2007 | Tsai | 257/758 |
| 2008/0001250 A1 * | 1/2008 | Ichimura et al. | 257/529 |
| 2008/0277756 A1 * | 11/2008 | Min et al. | 257/529 |

* cited by examiner

*Primary Examiner* — Victor A Mandala
*Assistant Examiner* — Whitney T Moore
(74) *Attorney, Agent, or Firm* — Winston Hsu; Scott Margo

(57) ABSTRACT

An anti-fuse structure and a method of fabricating the same are described. The anti-fuse structure is disposed over a substrate having at least one device and a copper layer therein. The anti-fuse structure includes a bottom conductive layer, an insulating layer and a top conductive layer. The bottom conductive layer is disposed over and electrically connected with the copper layer. The insulating layer is conformally disposed over the bottom conductive layer covering a corner or a downward turning portion of the bottom conductive layer to form a turning portion of the insulating layer. The top conductive layer is conformally disposed over the insulting layer covering the turning portion of the insulating layer.

24 Claims, 9 Drawing Sheets

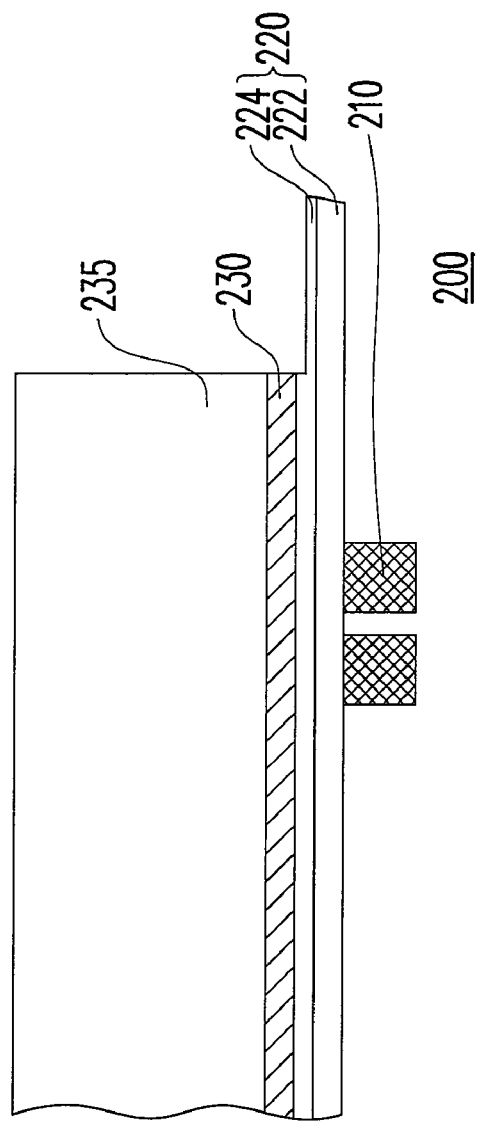
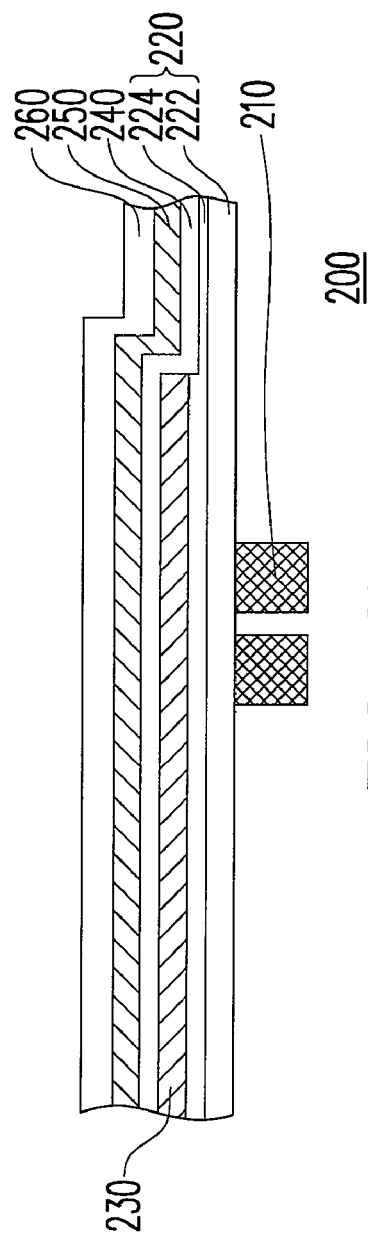
FIG. 2A
FIG. 2B

ANTI-FUSSE STRUCTURE AND METHOD OF FABRICATING THE SAME

BACKGROUND OF THE INVENTION

1. Field of Invention

This invention relates to a circuit structure and fabrication thereof, and more particularly to a circuit structure with an anti-fuse and a method of fabrication the same.

2. Description of Related Art

An anti-fuse typically has a metal-insulator-metal (MIM) structure. To program a circuit or to store digital information with an anti-fuse, a high voltage is applied to the same to breakdown the insulator therein so that the two metal layers are electrically connected and the anti-fuse is at an On-state that is also called a programmed state. If no voltage is applied to an anti-fuse, the two metal layers are electrically disconnected and the anti-fuse is at an Off-state that is also called a default state.

Such an anti-fuse is traditionally formed in a front-end process and a low-end Al-process. However, with the raise in the integration degree of devices, the number of metal interconnects is increased and the requirements to the conductance and linewidth of the same are also higher, so that Al is often not a suitable material for an anti-fuse. Since copper (Cu) has low electric resistance, good anti-electromigration property and a much higher melting point (~1060° C.), the Al-process is gradually replaced by the Cu-process. Hence, an anti-fuse that can be applied to a Cu-process and formed in a back-end process is desired currently.

SUMMARY OF THE INVENTION

Accordingly, this invention provides an anti-fuse structure that can be disposed in a back-end process, used as a one-time programmable (OTP) memory and disposed over a copper interconnect and is thus satisfactory to current semiconductor processes.

This invention further provides a method of fabricating an anti-fuse structure, which can be integrated in a back-end process and applied to a copper process and also allows miniaturization of the devices.

The anti-fuse structure of this invention is disposed over a substrate having at least one device and a copper layer therein, and includes a bottom conductor layer, an insulating layer and a top conductor layer. The bottom conductor layer is disposed over and electrically connected with the copper layer, having a corner or a downward turning portion. The insulating layer is conformally disposed over the bottom conductor layer and covers the corner or the downward turning portion of the bottom conductor layer to form a turning portion of the insulating layer. The top conductor layer is conformally disposed over the insulating layer and covers the turning portion of the insulating layer.

In an embodiment, the substrate further has a dielectric layer thereon disposed between the substrate and a portion of the bottom conductor layer, wherein the turning portion of the insulating layer is located around an edge of the dielectric layer.

In an embodiment, the bottom conductor layer is in contact with the copper layer. In such a case, the substrate may further have thereon a dielectric layer between an end of the bottom conductor layer and the substrate. The substrate may further have thereon another dielectric layer between another end of the bottom conductor layer and the substrate. In addition, it is possible that the two ends of the bottom conductor layer are respectively electrically connected with two underlying copper layers.

In an embodiment, the substrate further has thereon a capacitor including a lower electrode, a capacitor dielectric layer and an upper electrode. The lower electrode and the bottom conductor layer are formed from the same layer, the capacitor dielectric layer and the insulating layer are formed from the same layers, and the upper electrode and the top conductor layer are formed from the same layer. The insulating layer may have a thickness less than that of the capacitor dielectric layer of the capacitor.

In an embodiment, the bottom conductor layer and the top conductor layer each comprise a material selected from the group consisting of titanium, titanium nitride, tungsten nitride, titanium tungsten nitride, tantalum, tantalum nitride, aluminum, nickel, zinc, zinc nitride, chromium and chromium nitride.

In an embodiment, the at least one device disposed in the substrate includes an interconnect and a MOS device or a memory device under the interconnect electrically connected with the interconnect.

In an embodiment, the above anti-fuse structure acts as an OTP memory.

A method of fabricating an anti-fuse structure of this invention is described as follows. A substrate having at least one device and a copper layer therein is provided. A dielectric layer that has therein an opening exposing the copper layer is formed over the substrate. A first conductor layer, an insulating material layer and a second conductor layer are sequentially formed over the substrate conformally filling in the opening. The second conductor layer and the insulating material layer are patterned to form a top conductor layer and an insulating layer the anti-fuse structure, wherein the insulating layer has a turning portion at an edge of the opening. The first conductor layer is patterned to form a bottom conductor layer of the anti-fuse structure.

In an embodiment, the insulating layer further has another turning portion at another edge of the opening in the dielectric layer. In addition, two portions of the bottom conductor layer respectively at the two edges of the opening may be respectively electrically connected with two underlying copper layers.

In an embodiment, an upper electrode, a capacitor dielectric layer and a bottom electrode of a capacitor are also formed in the steps of patterning the second conductor layer, the insulating material layer and the first conductor layer. In such a case, a portion of the insulating material layer over the opening may be removed after the insulating material layer is formed but before the second conductor layer is formed, so that the insulating layer of the anti-fuse is thinner than the capacitor dielectric layer.

In an embodiment, the at least one device disposed in the substrate includes an interconnect and a MOS device or a memory device under the interconnect electrically connected with the interconnect.

Another method of fabricating an anti-fuse structure of the invention is described below. A substrate having at least one device and a copper layer therein is provided. A dielectric layer and a first conductor layer are formed over the substrate. A portion of the first conductor layer is removed such that the remaining first conductor layer has a sidewall. An insulating material layer and a second conductor layer are sequentially formed conformally covering the first conductor layer. The second conductor layer and the insulating material layer are patterned to form a top conductor layer and an insulating layer of the anti-fuse structure, wherein the insulating layer has a turning portion around the sidewall of the first conductor layer. The first conductor layer is patterned to form a bottom conductor layer of the anti-fuse structure.

In an embodiment, an upper electrode, a capacitor dielectric layer and a bottom electrode of a capacitor are also formed in the steps of patterning the second conductor layer, the insulating material layer and the first conductor layer.

In an embodiment, a portion of the dielectric layer is also removed in the step of removing a portion of the first conductor layer.

The anti-fuse structure of this invention can be formed over an interconnect in a back-end process, applied to a copper process and used as an OTP memory. Therefore, the anti-fuse structure of this invention not only allows metal anti-fuses to be applied in a process of next generation to increase the integration degree of devices, but also can be formed in a process integrated with capacitor fabrication so that no new process is needed to develop and the process complexity and cost are both reduced.

In order to make the aforementioned and other objects, features and advantages of the present invention comprehensible, a preferred embodiment accompanied with figures is described in detail below.

BRIEF DESCRIPTION OF THE DRAWINGS

FIGS. 2A-2E illustrate a method of fabricating an anti-fuse structure according to a second embodiment of this invention that is integrated with a capacitor process.

DESCRIPTION OF EMBODIMENTS

FIGS. 1A-1E illustrate a method of fabricating an anti-fuse structure according to a first embodiment of this invention that is integrated with a capacitor process. FIGS. 1F-1G respectively illustrate two exemplary circuit structures including the anti-fuse structure illustrated in FIG. 1E.

Figure 1A:
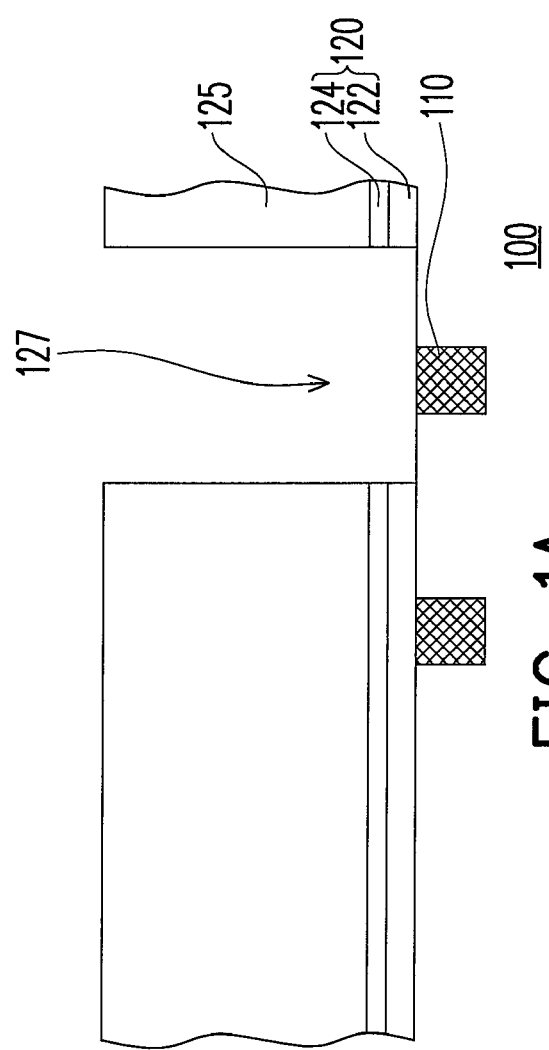
FIGS. 1A-1E illustrate a method of fabricating an anti-fuse structure according to a first embodiment of this invention that is integrated with a capacitor process.

Referring to FIG. 1A, a substrate 100 having at least one device (not shown) and a copper layer 110 therein is provided, wherein the copper layer 110 may be a copper line or a part of a copper interconnect. The device in the substrate 100 is exemplified later in reference of FIG. 1F. A dielectric layer 120 is formed over the substrate 100, having therein an opening 127 exposing the copper layer 110. The dielectric layer 120 may include at least one dielectric material selected silicon oxide, silicon nitride, silicon oxynitride and so forth. In the illustrated embodiment, the dielectric layer 120 includes a bottom layer 122 of silicon nitride and a top layer 124 of silicon oxide. The opening 127 in the dielectric layer 120 may be formed by forming a photoresist layer 125 with a corresponding opening pattern therein on the dielectric layer 120 and removing the exposed portion of the dielectric layer 120.

Figure 1B:
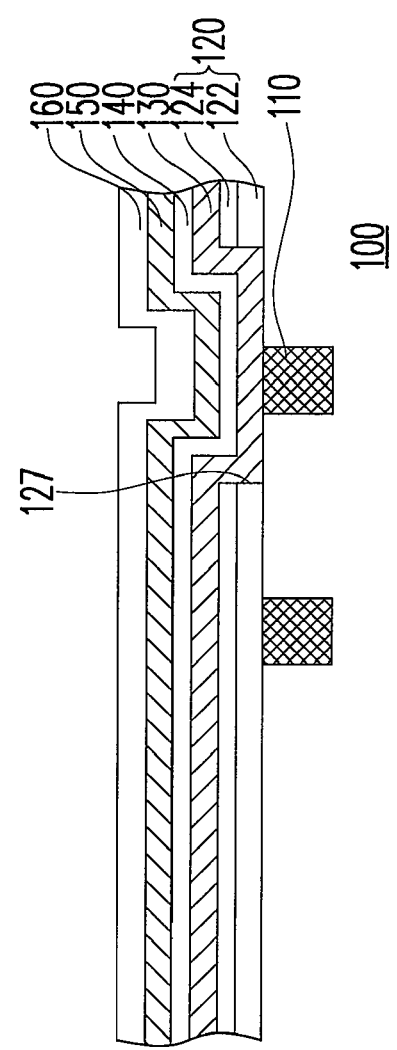

Referring to FIG. 1B, the patterned photoresist layer 125 is removed through wet or dry stripping, and then a first conductor layer 130, an insulating material layer 140 and a second conductor layer 150 are conformally formed over the substrate 100 in sequence filling in the opening 127. The first conductor layer 130 and the second conductor layer 150 each may include a material selected from the group consisting of titanium, titanium nitride, tungsten nitride, titanium tungsten nitride, tantalum, tantalum nitride, aluminum, nickel, zinc, zinc nitride, chromium and chromium nitride, and may be formed with physical vapor deposition (PVD) or chemical vapor deposition (CVD). The insulating material layer 140 may include a single layer of silicon oxide, silicon nitride or silicon oxynitride, or two or more layers of different dielectric materials such as an ONO composite layer. The insulating material layer 140 may be formed through CVD. In an embodiment, a passivation layer 160 is further formed covering the second conductor layer 150, possibly including TEOS-oxide. In another embodiment, a portion of the insulating material layer 140 over the opening 127 is removed after the insulating material layer 140 is formed but before the second conductor layer 150 is formed, so that the thickness of the portion of the insulating material layer 140 is reduced and the breakdown voltage of the anti-fuse formed later is adjusted.

Figure 1C:
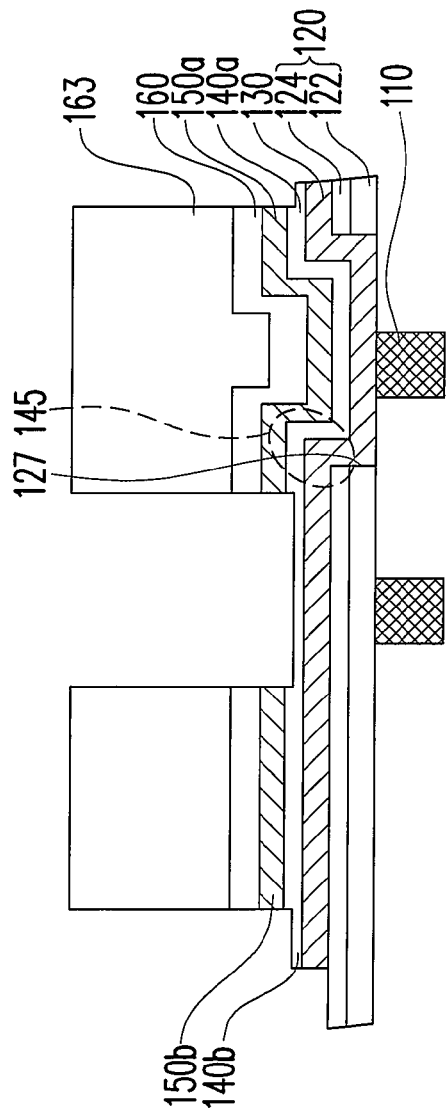

Referring to FIG. 1C, the second conductor layer 150 and the insulating layer 140 are patterned to form a top conductor layer 150a and an insulating layer 140a of the anti-fuse, wherein the insulating layer 140a has a turning portion 145 around an edge of the dielectric layer 120. The second conductor layer 150 and the insulating layer 140 may be patterned as follows. A patterned photoresist layer 163 that covers the corresponding portion of the second conductor layer 150 is formed over the substrate 100. The patterned photoresist layer 163 is then used as an etching mask to remove the exposed portions of the second conductor layer 150 and the insulating material layer 140, possibly with a dry etching method like a reactive ion etching (RIE) method. In this embodiment, the insulating material layer 140 exposed by the patterned photoresist layer 163 is not completely removed but is retained as a quite thin layer. The patterned photoresist layer 163 is then removed.

Moreover, in addition to the top conductor layer 150a and the insulating layer 140a, an upper electrode 150b and a capacitor dielectric 140b of a capacitor may also be formed from the second conductor layer 150 and the insulating material layer 140 simultaneously with the top conductor layer 150a and the insulating layer 140a of the anti-fuse structure, as shown in FIG. 1C.

Figure 1D:
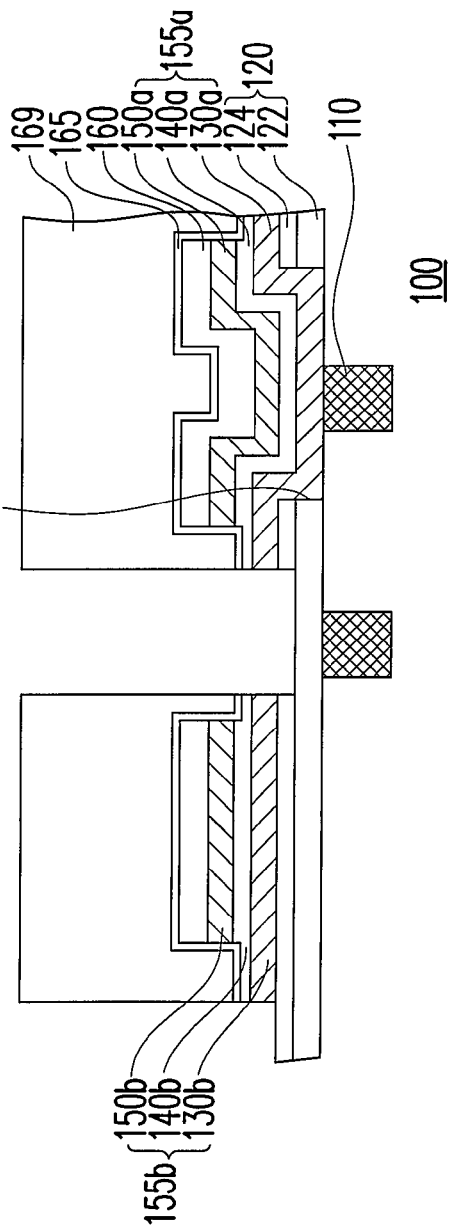
Figure 1E:
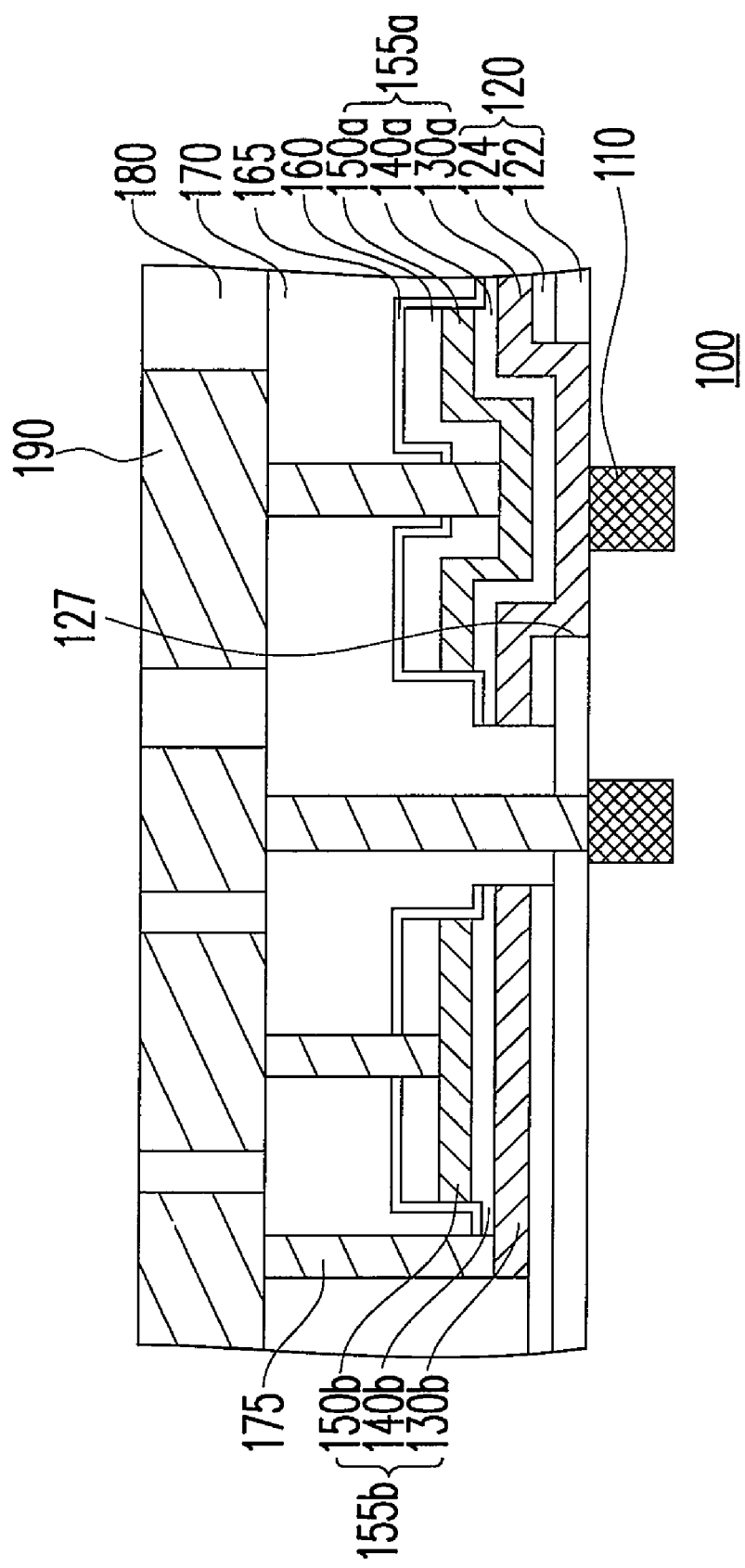
Figure 1F:
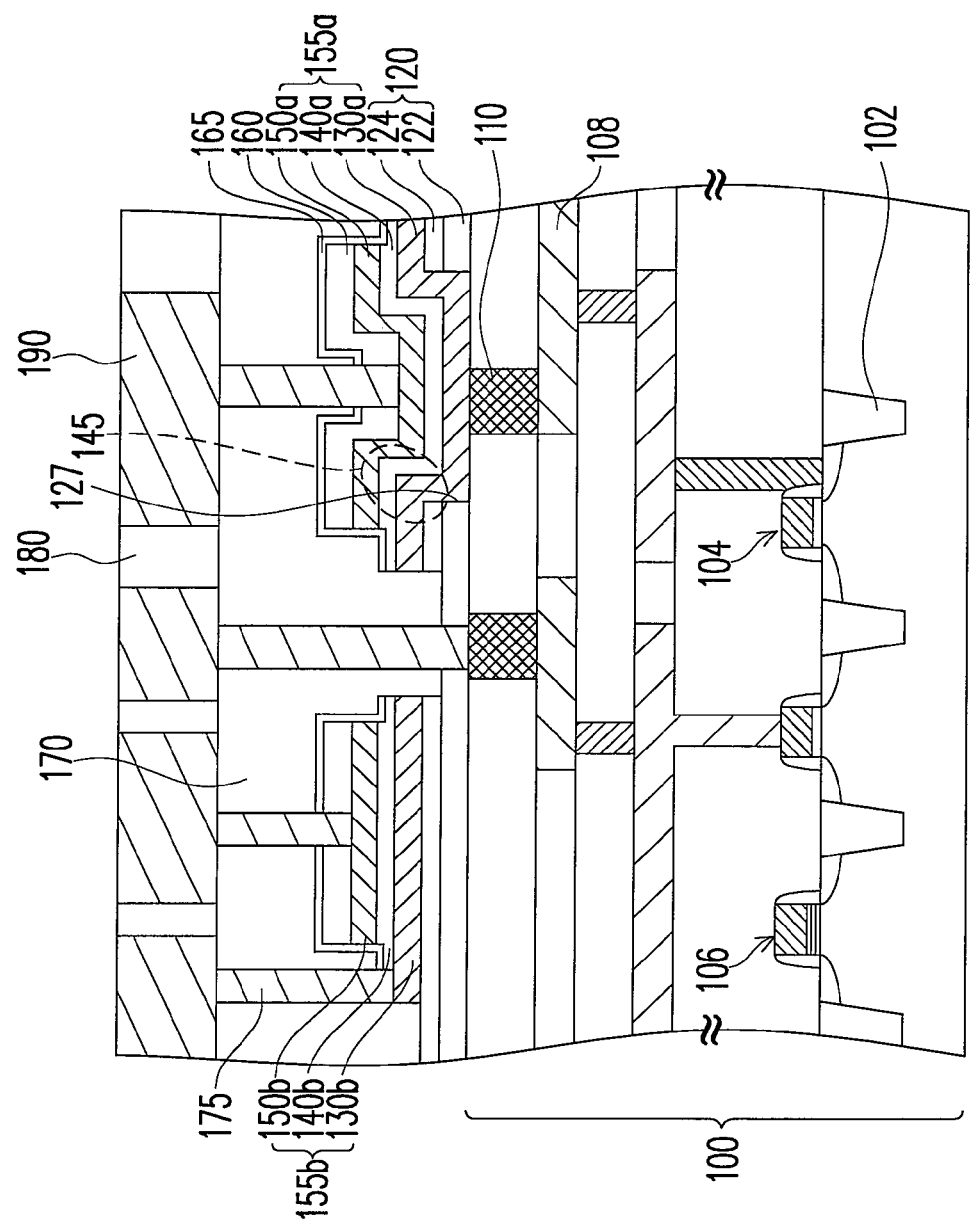
FIGS. 1F-1G respectively illustrate two exemplary circuit structures including the anti-fuse structure illustrated in FIG. 1E.
Figure 1G:
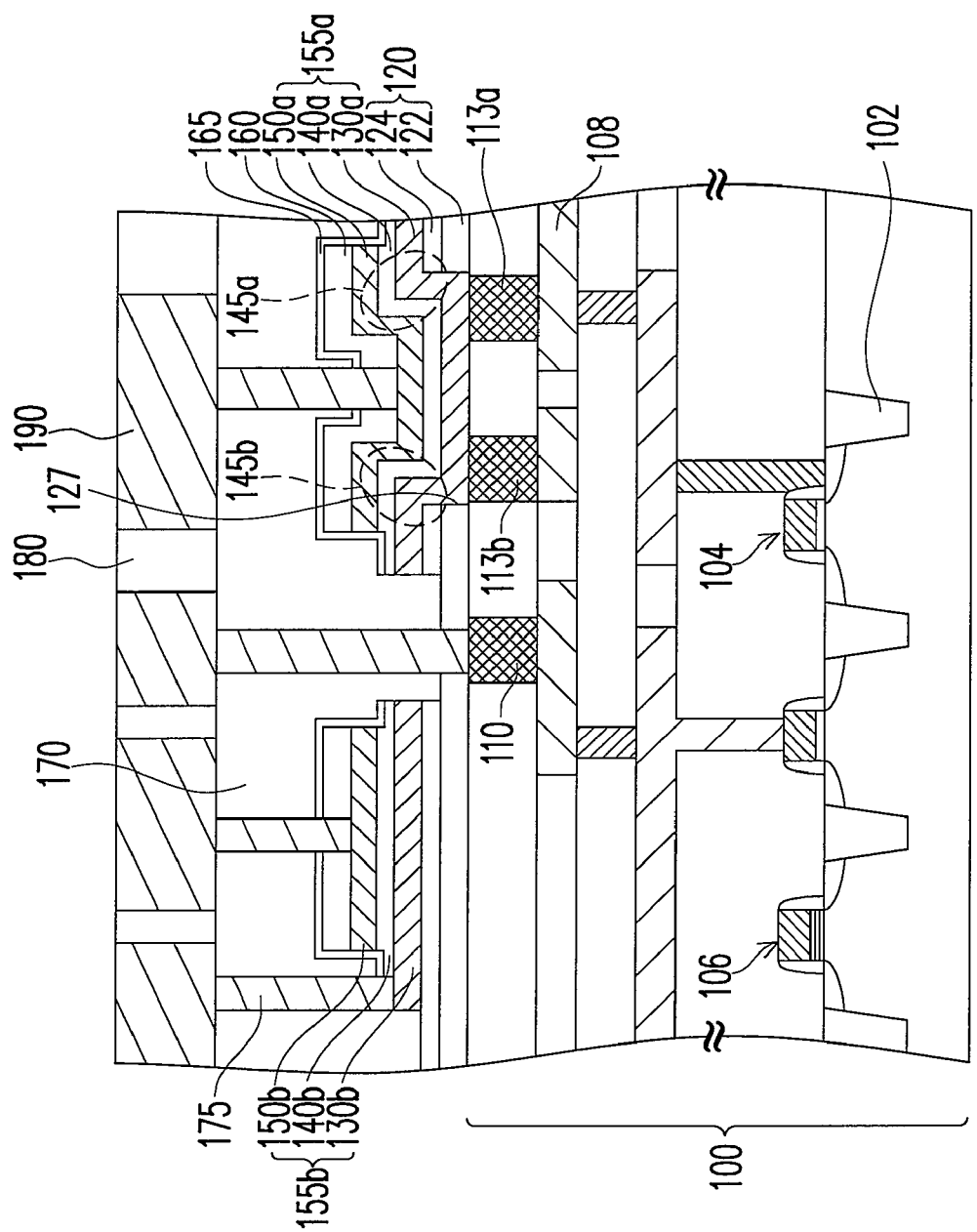

Referring to FIG. 1D, after the patterned photoresist layer 163 is removed, another passivation layer 165 may be further formed over the passivation 160, and then the first conductor layer 130 is patterned to form a bottom conductor layer 130a. The bottom conductor layer 130a, the insulating layer 140a and the top conductor layer 150a together constitute an anti-fuse structure 155a of this invention. The first conductor layer 130 may be patterned by forming a patterned photoresist layer 169 over the substrate 100, using the patterned photoresist layer 169 as an etching mask to remove a portion of the first conductor layer 130 and then removing the patterned photoresist layer 169. The portion of the first conductor layer 130 may be removed with a dry etching method like the RIE etching method. In addition, a lower electrode 130b of the capacitor may also be defined from the first conductor layer 130 simultaneously with the bottom conductor layer 130a of the anti-fuse structure. The lower electrode 130b, the capacitor dielectric layer 140b and the upper electrode 150b together constitute a capacitor 155b. Such a capacitor 155b may be seen in a multimedia card (MMC).

In an embodiment, the insulating material layer 140 over the opening 127 has been partially removed after being formed, so that the insulating layer 140a of the anti-fuse 155a is thinner than the capacitor dielectric layer 140b of the capacitor 155b, i.e, the capacitor dielectric layer 140b of the capacitor 155b has a thickness larger than that of the insulating layer 140a of the anti-fuse 155a.

Referring to BE, an inter-layer dielectric (ILD) layer 170, conductive plugs 175, a dielectric layer 180 and Al-pads 190 are sequentially formed over the substrate 100 so that the circuit structure can be operated by applying suitable voltages to certain nodes. Possible methods of forming the ILD layer 170, the conductive plugs 175, the dielectric layer 180 and the Al-pads 190 are well known in the prior art and not described here.

Referring to FIG. 1F, it is noted that the anti-fuse in this embodiment is formed in a back-end process while at least one device has been formed in the substrate 100. The device may include an interconnect 108 and a MOS device 104 and/or a memory device 106 under the interconnect 108 electrically connected with the interconnect 108. The MOS devices 104 and the memory devices 106 may be separated by an isolation structure 102. Alternatively, the device in the substrate 100 may be a passive device like an inductor, a capacitor or a resistor, or a memory device like non-volatile memory or DRAM, depending on the application. The anti-fuse structure is not limited to form over any specific kind of device.

Since the corner or the downward turning portion of the bottom conductor layer 130a of the anti-fuse 155a creates a higher electric field, the turning portion of the insulating layer 140a can be breakdown with a lower voltage than before. When the anti-fuse 155a is used as an OTP memory, it can be programmed with the breakdown.

Referring to FIG. 1G, since the anti-fuse 155a have two turning portions 145a and 145b, in another example, the opening 127 may be formed over two copper layers 113a and 113b, so that two portions of the bottom conductor layer 130a respectively under the two turning portions 145a and 145b are electrically connected with the two copper layers 113a and 113b respectively. Thus, when the anti-fuse 155a is used as an OTP memory, the OTP memory can store two bits in each cell at the turning portions 145a and 145b respectively.

In addition to the above mentioned, the anti-fuse structure of this invention may have other layout formed through other process. For example, FIGS. 2A-2E illustrate a method of fabricating an anti-fuse structure according to a second embodiment of this invention that is also integrated with a capacitor process. FIG. 2F illustrates an exemplary circuit structure including the anti-fuse structure illustrated in FIG. 2E. The materials and forming methods of analogous layers in this embodiment can be similar to those in the first embodiment.

Referring to FIG. 2A, a substrate 200 having at least one device (not shown) and a copper layer 210 therein is provided, wherein the device in the substrate 200 is exemplified later in reference of FIG. 2F. A dielectric layer 220 and a first conductor layer 230 are sequentially formed over the substrate 100, wherein the dielectric layer 220 may include a bottom layer 222 of silicon nitride and a top layer 224 of silicon oxide. A portion of the first conductor layer 230 is removed such that the remaining first conductor layer 230 has a sidewall, wherein a portion of the exposed dielectric layer 220 (the exposed top layer 224) may be removed successively. The portion of the first conductor layer 230 may be removed by forming a photoresist layer 235 over the first conductor layer 230 and then removing the exposed portion thereof with a dry etching method like an RIE method.

Referring to FIG. 2B, the patterned photoresist layer 235 is removed through wet or dry stripping, and then an insulating material layer 240 and a second conductor layer 250 are conformally formed over the substrate 200 in sequence. The first conductor layer 230 and the second conductor layer 250 each may include a material selected from the group consisting of titanium, titanium nitride, tungsten nitride, titanium tungsten nitride, tantalum, tantalum nitride, aluminum, nickel, zinc, zinc nitride, chromium and chromium nitride. The insulating material layer 240 may include a single layer of silicon oxide, silicon nitride or silicon oxynitride, or two or more layers of different dielectric materials such as an ONO composite layer. The insulating material layer 240 may be formed through CVD. In an embodiment, a passivation layer 260 is further formed covering the second conductor layer 250, possibly including TEOS-oxide. In another embodiment, the step-like portion of the insulating material layer 240 is partially removed after the insulating material layer 240 is formed but before the second conductor layer 250 is formed, so that the thickness of the step-like portion of the insulating material layer 240 is reduced and the breakdown voltage of the anti-fuse formed later is adjusted.

Figure 2C:
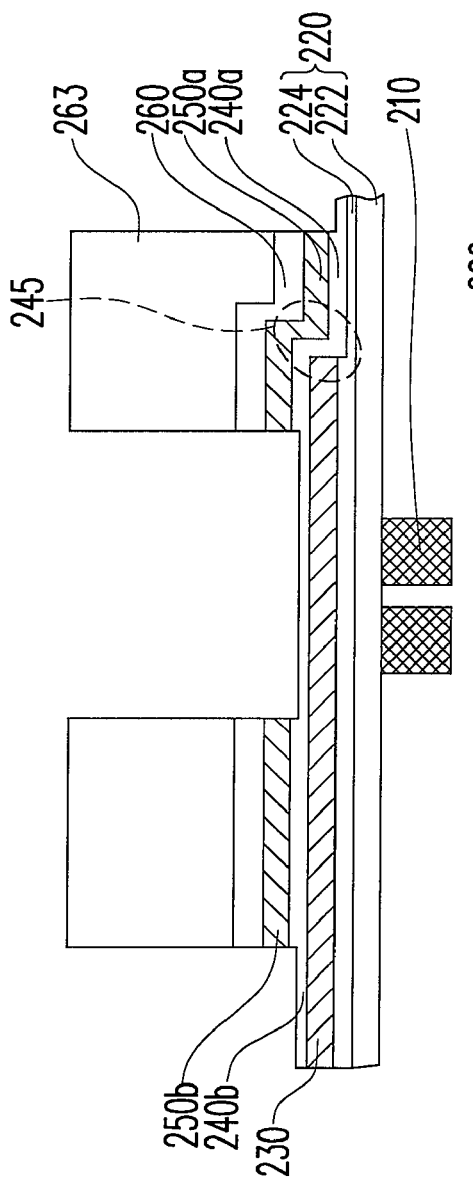

Referring to FIG. 2C, the second conductor layer 250 and the insulating layer 240 are patterned to form a top conductor layer 250a and an insulating layer 240a of the anti-fuse, wherein the insulating layer 240a has a turning portion 245 at the sidewall of the first conductor layer 230. The second conductor layer 250 and the insulating layer 240 may be patterned as follows. A patterned photoresist layer 263 that covers the corresponding portion of the second conductor layer 250 is formed over the substrate 200. The patterned photoresist layer 263 is then used as an etching mask to remove the exposed portions of the second conductor layer 250 and the insulating material layer 240, possibly by dry etching like RIE. In the illustrated embodiment, the insulating material layer 240 exposed by the patterned photoresist layer 263 is not completely removed but is retained as a quite thin layer. The patterned photoresist layer 263 is then removed.

Moreover, in addition to the top conductor layer 250a and the insulating layer 240a, an upper electrode 250b and a capacitor dielectric 240b of a capacitor may also be formed from the second conductor layer 250 and the insulating material layer 240 simultaneously with the top conductor layer 250a and the insulating layer 240a of the anti-fuse structure, as shown in FIG. 2C.

Figure 2D:
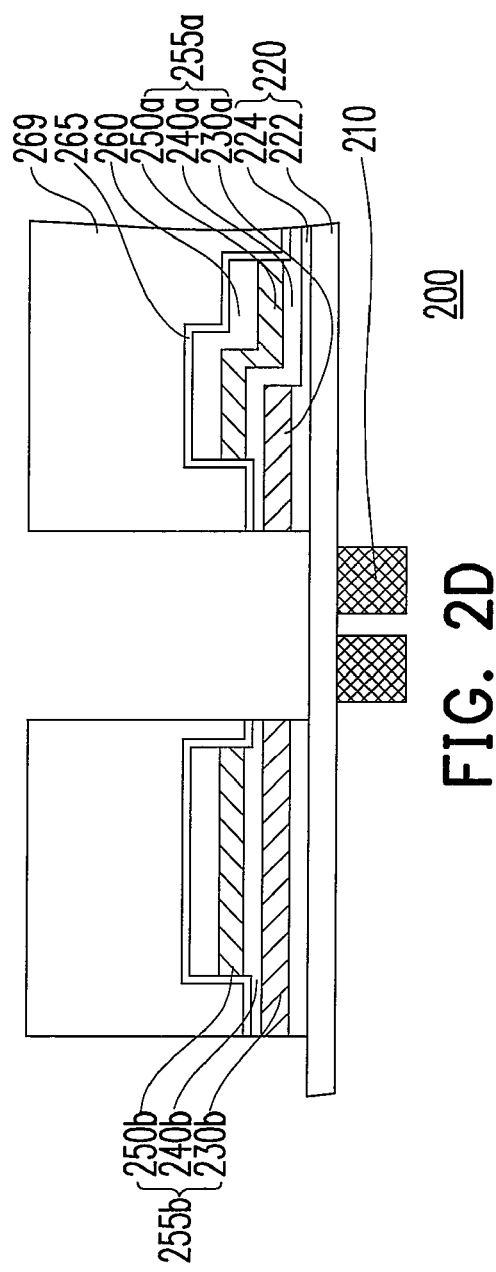
Figure 2E:
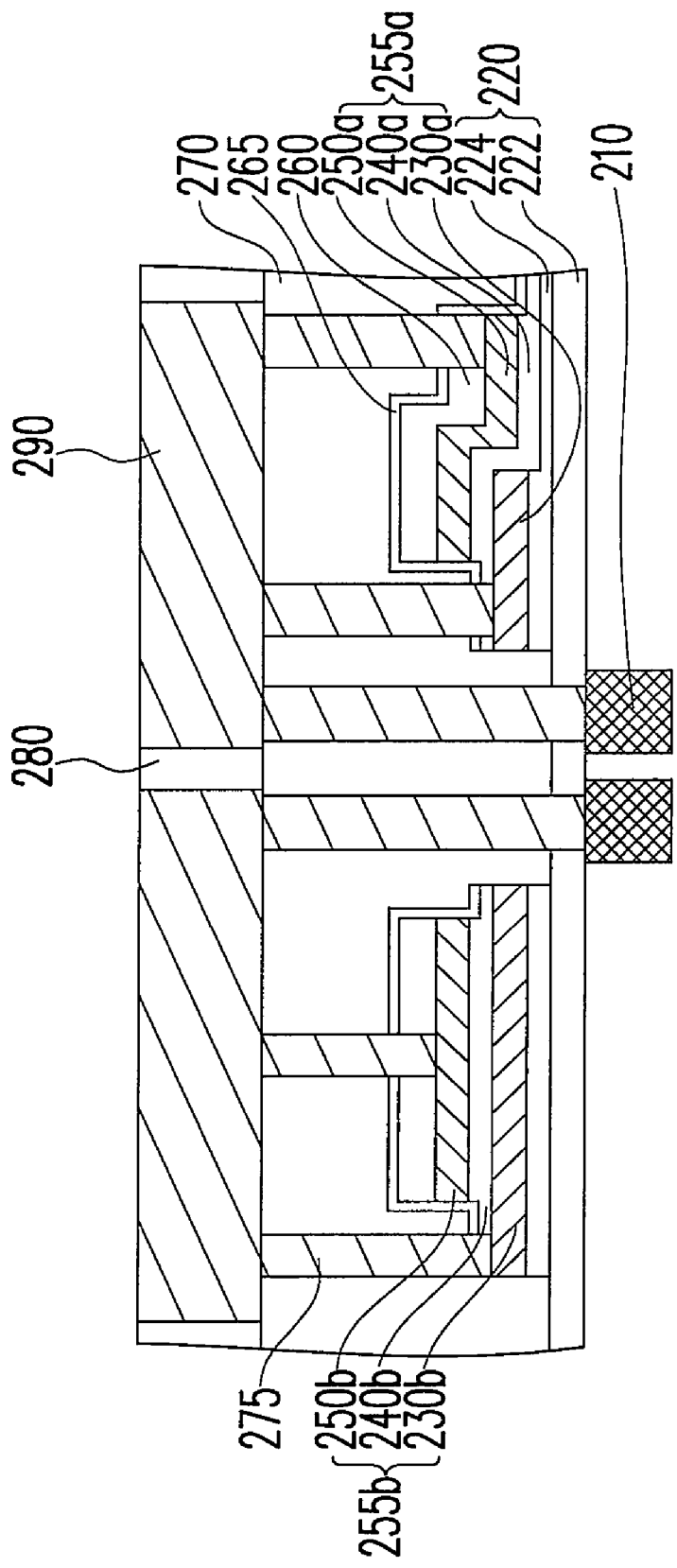
Figure 2F:
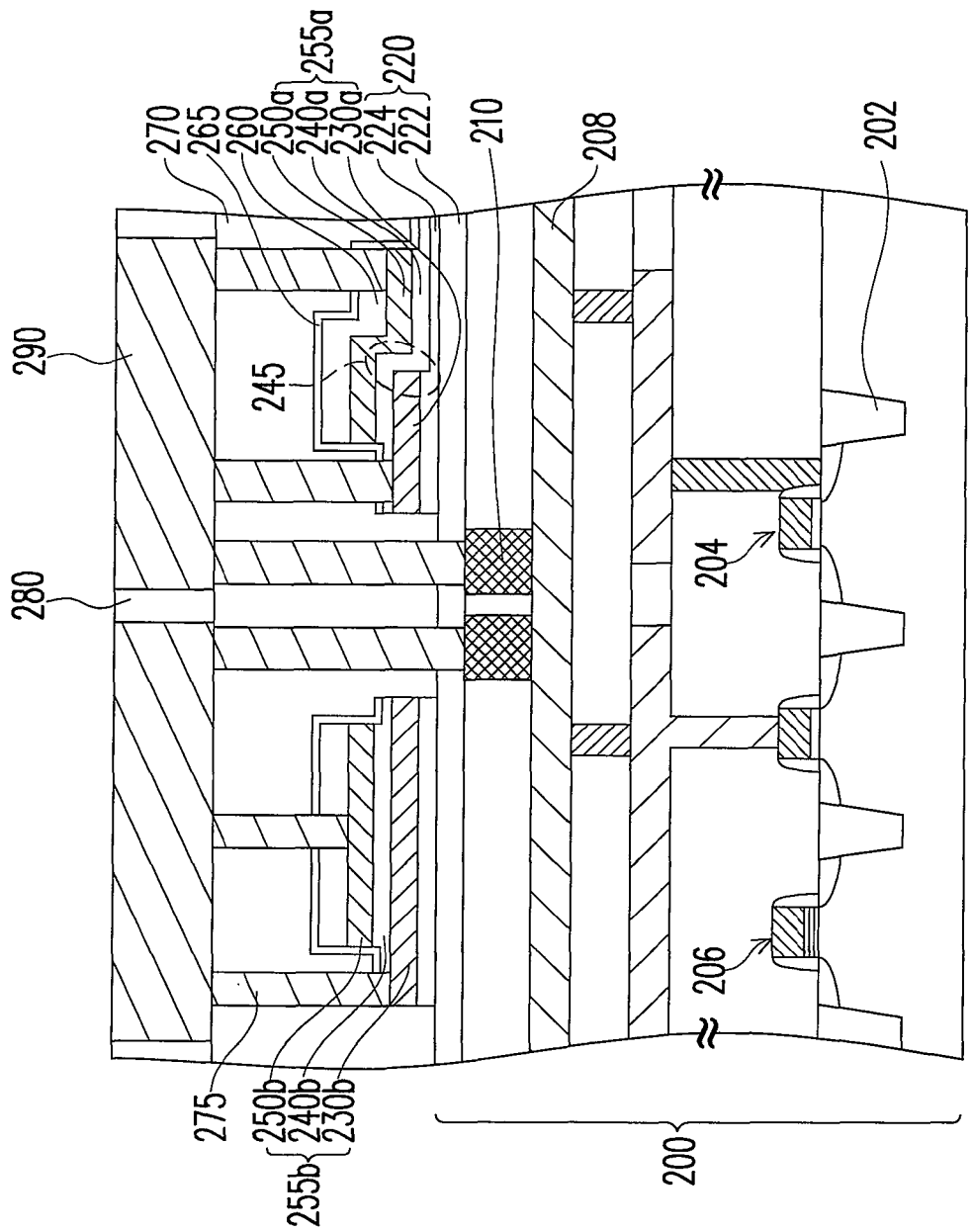
FIG. 2F illustrates an exemplary circuit structure including the anti-fuse structure illustrated in FIG. 2E.

Referring to FIG. 2D, after the patterned photoresist layer 263 is removed, another passivation layer 265 may be further formed over the passivation 260, and then the first conductor layer 230 is patterned to form a bottom conductor layer 230a. The bottom conductor layer 230a, the insulating layer 240a and the top conductor layer 250a together constitute an anti-fuse structure 255a of this invention. The first conductor layer 230 may be patterned by forming a patterned photoresist layer 269 over the substrate 200, using the patterned photoresist layer 269 as an etching mask to remove a portion of the first conductor layer 230 and then removing the patterned photoresist layer 269. In addition, a lower electrode 230b of the capacitor may also be defined from the first conductor layer 230 simultaneously with the bottom conductor layer 230a of the anti-fuse structure. The lower electrode 230b, the capacitor dielectric layer 240b and the upper electrode 250b together constitute a capacitor 255b. Such a capacitor 255b may be seen in a multimedia card (MMC).

In an embodiment, the insulating material layer 240 around the sidewall of the first conductor layer 230 has been partially removed after being formed, so that the insulating layer 240a of the anti-fuse 255a is thinner than the capacitor dielectric layer 240b of the capacitor 255b, i.e, the capacitor dielectric layer 240b of the capacitor 255b has a thickness larger than that of the insulating layer 240a of the anti-fuse 255a to meet different requirements on the electrical property.

Referring to 2E, an ILD layer 270, conductive plugs 275, a dielectric layer 280 and Al-pads 290 are sequentially formed over the substrate 200, as in the case of the first embodiment where an ILD layer 170, conductive plugs 175, a dielectric layer 180 and Al-pads 190 are sequentially formed over the substrate 100.

Referring to FIG. 2F, it is noted that the anti-fuse in this embodiment is formed in a back-end process while at least one device has been formed in the substrate 200. The device may include an interconnect 208 and a MOS device 204 and/or a memory device 206 under the same electrically connected with the same. The MOS devices 204 and the memory devices 206 may be separated by an isolation structure 202.

Since the corner or the downward turning portion of the bottom conductor layer 230a of the anti-fuse 255a creates a higher electric field, the turning portion of the insulating layer 240a can be breakdown with a lower voltage than before. When the anti-fuse 255a is used as an OTP memory, it can be programmed with the breakdown.

The anti-fuse structure of this invention can be formed over an interconnect in a back-end process, applied to a copper process and used as an OTP memory. Therefore, the anti-fuse structure of this invention not only allows metal anti-fuses to be applied in a process of next generation to increase the integration degree of devices, but also can be formed in a process integrated with capacitor fabrication so that no new process is needed to develop and the process complexity and cost are both reduced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An anti-fuse structure, disposed over a substrate having at least one device and a copper layer therein, and comprising:
    a bottom conductor layer disposed over and electrically connected with the copper layer, having a corner or a downward turning portion;
    an insulating layer conformally disposed over the bottom conductor layer and covering the corner or the downward turning portion of the bottom conductor layer to form a turning portion of the insulating layer;
    a top conductor layer conformally disposed over the insulating layer and covering the turning portion of the insulating layer;
    a dielectric layer disposed between the substrate and the bottom conductor layer; and
    another dielectric layer disposed between the dielectric layer and the substrate, wherein the bottom conductor layer is aligned with an edge of the dielectric layer and covering the another dielectric layer.

2. The anti-fuse structure of claim 1, wherein the substrate further has the dielectric layer thereon disposed between the substrate and a portion of the bottom conductor layer, and the turning portion of the insulating layer is located around an edge of the dielectric layer.

3. The anti-fuse structure of claim 1, wherein the bottom conductor layer is in contact with the copper layer.

4. The anti-fuse structure of claim 3, wherein the substrate further has thereon the dielectric layer disposed between an end of the bottom conductor layer and the substrate.

5. The anti-fuse structure of claim 4, wherein the substrate further has thereon the another dielectric layer disposed between another end of the bottom conductor layer and the substrate.

6. The anti-fuse structure of claim 5, wherein the two ends of the bottom conductor layer are respectively electrically connected with two underlying copper layers.

7. The anti-fuse structure of claim 1, wherein the substrate further has thereon a capacitor including a lower electrode, a capacitor dielectric layer and an upper electrode, the lower electrode and the bottom conductor layer are formed from the same layer, the capacitor dielectric layer and the insulating layer are formed from the same layers, and the upper electrode and the top conductor layer are formed from the same layer.

8. The anti-fuse structure of claim 7, wherein a thickness of the insulating layer of the anti-fuse is less than a thickness of the capacitor dielectric layer of the capacitor.

9. The anti-fuse structure of claim 1, wherein the bottom conductor layer and the top conductor layer each comprise a material selected from the group consisting of titanium, titanium nitride, tungsten nitride, titanium tungsten nitride, tantalum, tantalum nitride, aluminum, nickel, zinc, zinc nitride, chromium and chromium nitride.

10. The anti-fuse structure of claim 1, wherein the at least one device comprises an interconnect and a MOS device or a memory device under the interconnect electrically connected with the interconnect.

11. The anti-fuse structure of claim 1, which acts as a one-time programmable (OTP) memory.

12. The anti-fuse structure of claim 1, wherein the dielectric layer and the another dielectric layer comprise different material.

13. An anti-fuse structure, disposed over a substrate having at least one device and a copper layer therein, and comprising:
    a bottom conductor layer disposed over and electrically connected with the copper layer, having a corner or a downward turning portion;
    an insulating layer conformally disposed over the bottom conductor layer and covering the corner or the downward turning portion of the bottom conductor layer to form a turning portion of the insulating layer;
    a top conductor layer conformally disposed over the insulating layer and covering the turning portion of the insulating layer, wherein an edge of the top conductor layer is not aligned with the edges of the insulating layer and the bottom conductor layer;
    a dielectric layer disposed between the substrate and the bottom conductor layer; and
    another dielectric layer disposed between the dielectric layer and the substrate, wherein the bottom conductor layer is aligned with an edge of the dielectric layer and covering the another dielectric layer.

14. The anti-fuse structure of claim 13, wherein the substrate further has the dielectric layer thereon disposed between the substrate and a portion of the bottom conductor layer, and the turning portion of the insulating layer is located around an edge of the dielectric layer.

15. The anti-fuse structure of claim 13, wherein the bottom conductor layer is in contact with the copper layer.

16. The anti-fuse structure of claim 15, wherein the substrate further has thereon the dielectric layer disposed between an end of the bottom conductor layer and the substrate.

17. The anti-fuse structure of claim 16, wherein the substrate further has thereon the another dielectric layer disposed between another end of the bottom conductor layer and the substrate.

18. The anti-fuse structure of claim 17, wherein the two ends of the bottom conductor layer are respectively electrically connected with two underlying copper layers.

19. The anti-fuse structure of claim 13, wherein the substrate further has thereon a capacitor including a lower electrode, a capacitor dielectric layer and an upper electrode, the lower electrode and the bottom conductor layer are formed from the same layer, the capacitor dielectric layer and the insulating layer are formed from the same layers, and the upper electrode and the top conductor layer are formed from the same layer.

20. The anti-fuse structure of claim 19, wherein a thickness of the insulating layer of the anti-fuse is less than a thickness of the capacitor dielectric layer of the capacitor.

21. The anti-fuse structure of claim 13, wherein the bottom conductor layer and the top conductor layer each comprise a material selected from the group consisting of titanium, titanium nitride, tungsten nitride, titanium tungsten nitride, tantalum, tantalum nitride, aluminum, nickel, zinc, zinc nitride, chromium and chromium nitride.

22. The anti-fuse structure of claim 13, wherein the at least one device comprises an interconnect and a MOS device or a memory device under the interconnect electrically connected with the interconnect.

23. The anti-fuse structure of claim 13, which acts as a one-time programmable (OTP) memory.

24. The anti-fuse structure of claim 13, wherein the dielectric layer and the another dielectric layer comprise different material.

* * * * *